(12) United States Patent
Kreindl et al.

(10) Patent No.: US 9,764,511 B2
(45) Date of Patent: Sep. 19, 2017

(54) NANOSTRUCTURE DIE, EMBOSSING ROLL, DEVICE AND METHOD FOR CONTINUOUS EMBOSSING OF NANOSTRUCTURES

(75) Inventors: Gerald Kreindl, Schärding (AT); Markus Wimplinger, Innkreis (AT); Thomas Glinsner, St. Florian (AT)

(73) Assignee: EV Group E. Thallner GmbH, St. Florian am Inn (AT)

( * ) Notice: Subject to any disclaimer, the term of this patent is extended or adjusted under 35 U.S.C. 154(b) by 644 days.

(21) Appl. No.: 14/343,866

(22) PCT Filed: Dec. 6, 2011

(86) PCT No.: PCT/EP2011/071912
§ 371 (c)(1),
(2), (4) Date: Mar. 10, 2014

(87) PCT Pub. No.: WO2013/083184
PCT Pub. Date: Jun. 13, 2013

(65) Prior Publication Data
US 2014/0232037 A1  Aug. 21, 2014

(51) Int. Cl.
*B29C 59/00* (2006.01)
*G03F 7/00* (2006.01)
(Continued)

(52) U.S. Cl.
CPC .......... *B29C 59/002* (2013.01); *B29C 59/021* (2013.01); *B82Y 10/00* (2013.01);
(Continued)

(58) Field of Classification Search
CPC ..... G03F 7/0002; B82Y 40/00; B29C 59/021; B29C 59/002; B29C 59/04; B29C 59/043; B29C 2059/023
(Continued)

(56) References Cited

U.S. PATENT DOCUMENTS 4,923,572 A * 5/1990 Watkins ................ B29C 59/002
205/69
5,266,257 A 11/1993 Kildune ........................ 264/224
(Continued)

FOREIGN PATENT DOCUMENTS

DE  39 32 198  4/1990  ............. B29C 59/02
DE  196 27 638  1/1998  ............. B41M 3/00
(Continued)

OTHER PUBLICATIONS

Office Action issued in corresponding Taiwanese Patent Application No. 101145503 dated Nov. 23, 2015 with English-translation Search Report containing relevant references.
(Continued)

*Primary Examiner* — Alison L Hindenlang
*Assistant Examiner* — Lawrence D Hohenbrink, Jr.
(74) *Attorney, Agent, or Firm* — Kusner & Jaffe

(57) ABSTRACT

A nanostructure die with a concavely curved nanostructured die surface for seamless embossing of at least one peripheral ring of a jacket surface of an embossing roll in a step-and-repeat process and an embossing roll for continuous embossing of nanostructures with an embossing layer, which has been applied on a body of revolution, with a jacket surface with at least one peripheral ring which is made seamless at least in the peripheral direction and which is embossed in the step-and-repeat process. Furthermore, the invention relates to a method and a device for producing such an embossing roll for continuous embossing of nanostructures as well as a method for producing such a nanostructure die and a method for producing an embossing substrate.

10 Claims, 5 Drawing Sheets

(51) Int. Cl.
*B29C 59/02* (2006.01)
*B82Y 10/00* (2011.01)
*B82Y 40/00* (2011.01)
B29C 59/04 (2006.01)
B29C 35/08 (2006.01)

(52) U.S. Cl.
CPC ............ *B82Y 40/00* (2013.01); *G03F 7/0002* (2013.01); *B29C 35/0888* (2013.01); *B29C 59/04* (2013.01); *B29C 59/043* (2013.01); *B29C 2035/0827* (2013.01); *B29C 2059/023* (2013.01)

(58) Field of Classification Search
USPC ..................... 264/219, 220, 225, 226, 227
See application file for complete search history.

(56) References Cited

U.S. PATENT DOCUMENTS 5,327,825 A * 7/1994 Parker ..................... B23P 15/24
101/28

2003/0187170 A1 * 10/2003 Burmeister ........... B29C 43/222
526/307.8

FOREIGN PATENT DOCUMENTS

| JP | 2-134229 | 5/1990 | ............. B29C 59/04 |
| WO | WO 2011/038741 | 4/2011 | ............... G03F 7/00 |

OTHER PUBLICATIONS

Taniguchi et al., "Large-diameter roll mold fabrication method using a small-diameter quartz roll mold and UV nanoimprint lithography," Journal of Vacuum Science & Technology B: Microelectronics and Nanometer Stuctures, vol. 29, No. 6, Jan. 1, 2011, p. 06FC08.

International Search Report for International Application No. PCT/EP2011/071912.

* cited by examiner

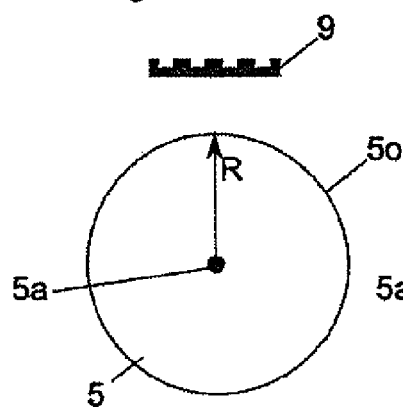
Fig. 2a
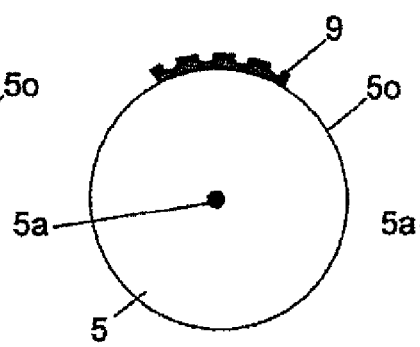
Fig. 2b
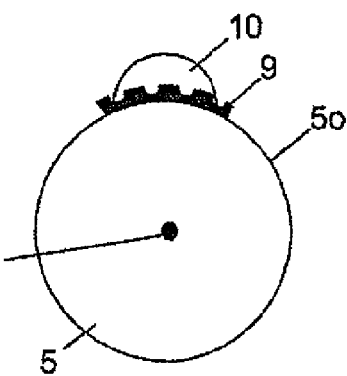
Fig. 2c
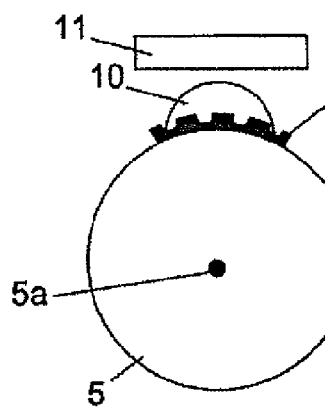
Fig. 2d
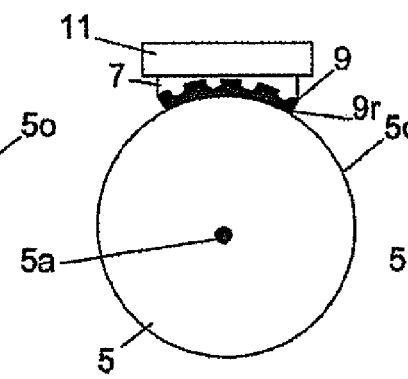
Fig. 2e
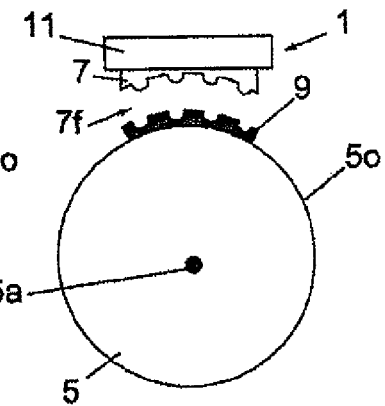
Fig. 2f
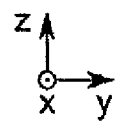

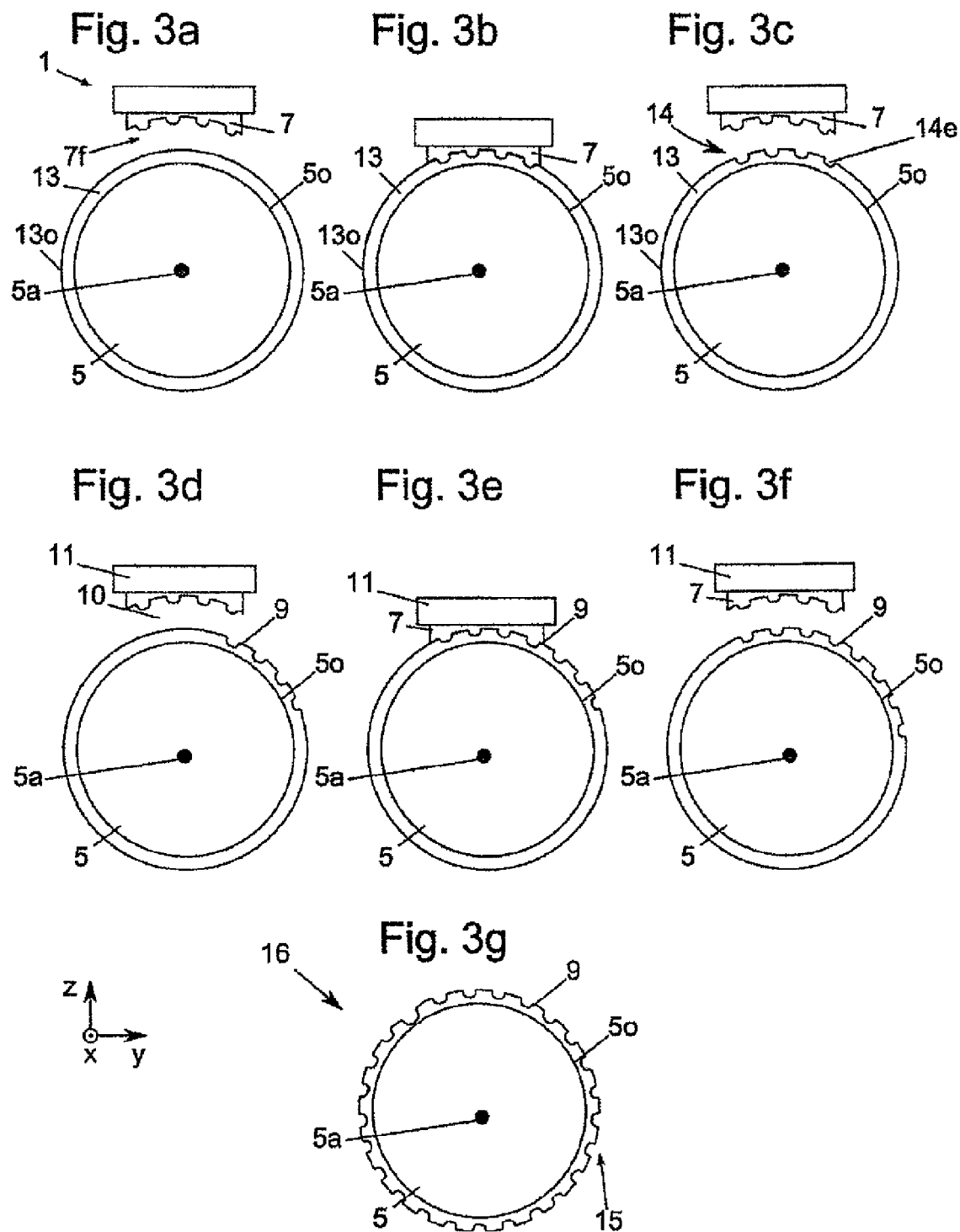

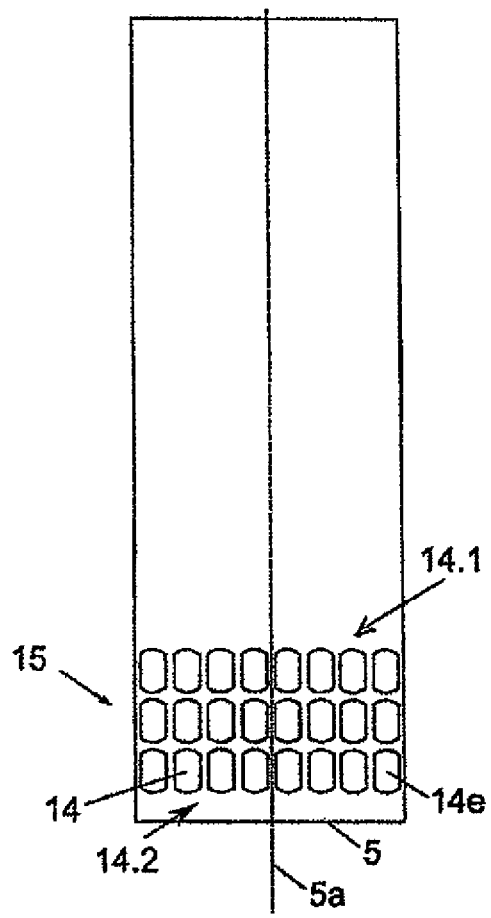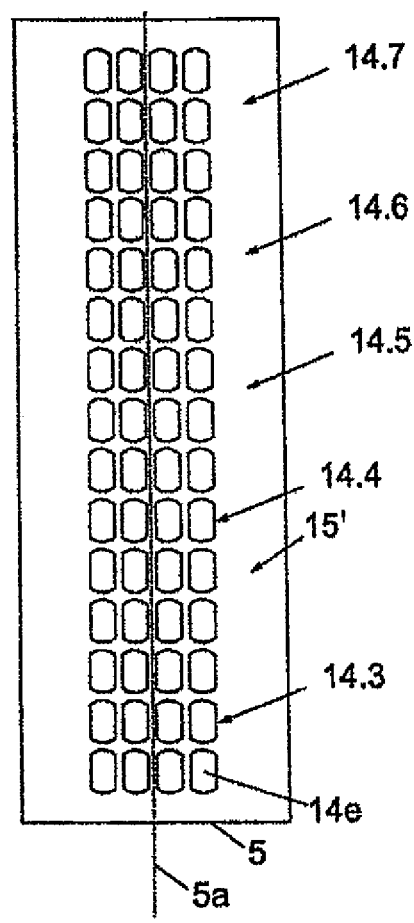

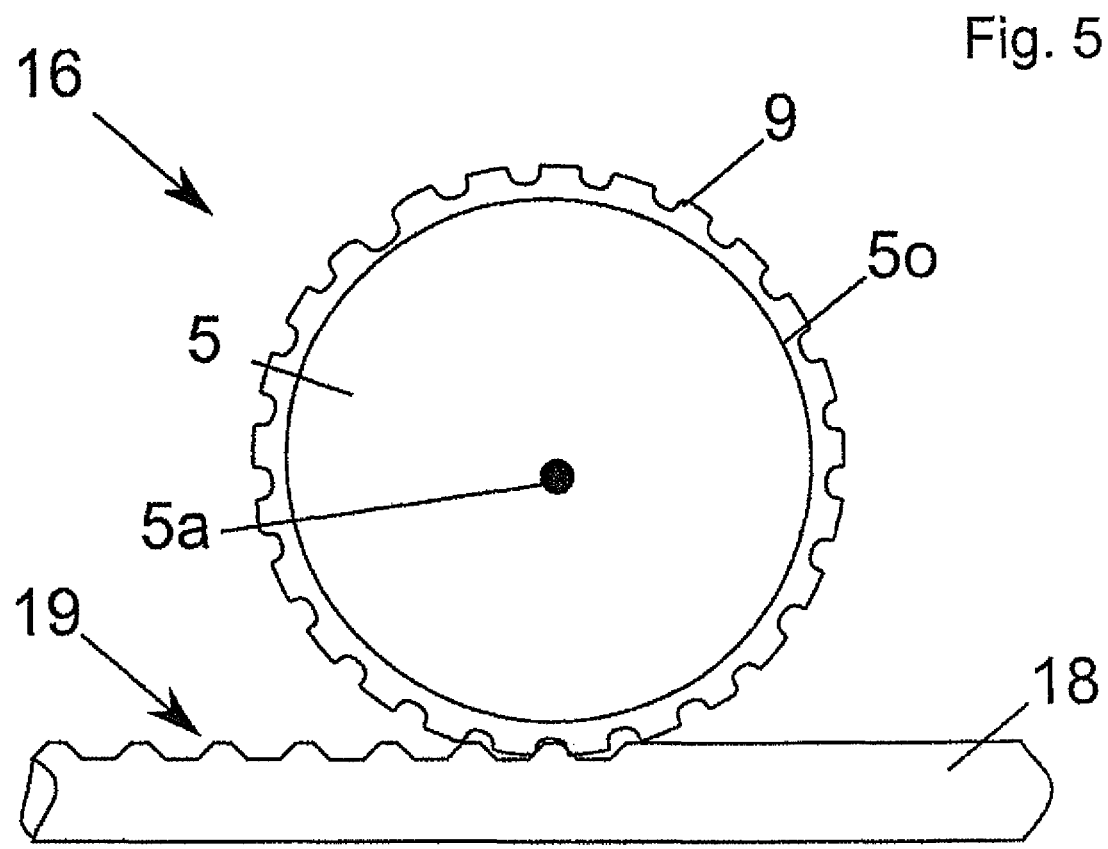

NANOSTRUCTURE DIE, EMBOSSING ROLL, DEVICE AND METHOD FOR CONTINUOUS EMBOSSING OF NANOSTRUCTURES

FIELD OF THE INVENTION

This invention relates to a nanostructure die for embossing of an embossing roll, an embossing roll for continuous embossing of nanostructures, a device for producing an embossing roll for continuous embossing of nanostructures, a method for producing a nanostructure die for producing an embossing roll, and a method for producing an embossing roll for continuous embossing of nanostructures. Moreover this invention relates to a method for producing an embossing substrate which has nanostructures.

BACKGROUND OF THE INVENTION

In the development of mass production technologies of nanostructured surfaces and semiconductor structures for large area applications such as for example foils or films, there is a demand for functioning roll-to-roll machines which are able to emboss continuous nanostructured and/or semiconductor structures via rolling onto a track or a long workpiece. Major problems prevail here, especially in an application for imprint lithography; this has not been satisfactorily resolved to date.

In particular, one problem is to produce continuous patterns in the submicron or nanometer range. It can be easily imagined that as the embossing structures become smaller and smaller the technical problems increase in the implementation of continuous application to an above average degree.

SUMMARY OF THE INVENTION

The object of this invention is therefore to devise a nanostructure die and an embossing roll and method and device for producing them, with which continuous embossing of nanostructures is possible even for very small dimensions of the nanostructures, especially relative to the size or to the diameter of the embossing roll, and reliable and reproducible results can be achieved. The diameters of current embossing rolls are known to one skilled in the art. The embodiment of the present invention is in any case suitable for any diameter.

This object is achieved with the features of the independent claim(s). Advantageous developments of the invention are given in the dependent claims. All combinations of at least two of the features given in the specification, the claims and/or the figures also fall within the framework of the invention. At the given value ranges values which lie within the indicated limits are also to be considered disclosed and claimed in any combination.

The invention is based on the idea of applying an embossing structure which is to be applied to the embossing roll in the step-and-repeat process such that there is seamless embossing on the entire periphery. To do this, according to the present invention a novel nanostructure die is disclosed which is suitable for a step-and-repeat process in order to apply a repeating structure on the periphery of the embossing roll.

It is also conceivable to apply the structure along one axis of rotation of a body of revolution in the step-and-repeat process. It is of special importance to produce a seamless microstructure or nanostructure with embossing in several steps so that the embossing roll in the later unwinding process can be transferred to the workpiece (producing an embossing substrate, also embossing product) more or less endlessly or continuously, therefore by a plurality of complete revolutions. The highly symmetrical and translational repetitions of the patterns which can be achieved with the step-and-repeat process makes it possible to generate materials with unique surface properties, especially with periodically repeating structures. Use is especially advantageous in the field of optics, for example in the imprinting of glass plates. Symmetry in optics is of very great importance, especially when the desired optical effects can be achieved with greatest precision by highly symmetrical structures. Seamless means that within the tolerances of the step-and-repeat process on the entire periphery homogenous structures are embossed, especially also on the transition of the last embossing step to the first embossing step of peripheral embossing of the embossing roll.

Therefore an independent invention is a nanostructure die with, for example, a concavely curved nanostructured die surface for seamless embossing of at least one peripheral ring of a jacket surface of an embossing roll in the step-and-repeat process. The die surface of the nanostructure die is thus matched to the jacket surface of the embossing roll so that the entire jacket surface of an embossing roll can be embossed with a single nanostructure die. The simultaneous use of several nanostructure dies in the embossing of an embossing roll is likewise conceivable according to the present invention.

To the extent the nanostructure die has a die carrier to which a die form which encompasses the die surface is connected, especially permanently, the handling of the nanostructure die in a corresponding device for embossing of the embossing roll is simplified.

It is especially advantageous if the die form is produced directly by the embossing roll which is to be embossed. In this way the curvature of the nanostructure die or of the die surface of the nanostructure die corresponds exactly to the embossing roll which is to be embossed.

According to one advantageous embodiment of the invention, the die carrier is transparent to electromagnetic waves, especially UV light, in order to be able to provide curing of the die form and/or of the embossing layer of the embossing roll, which layer is to be embossed.

To the extent a radiation source for electromagnetic waves, especially a UV source, is located within the embossing roll, especially in the form of a hollow cylinder, there is preferably a shielding means for the electromagnetic waves in regions of the embossing roll which are not to be exposed, especially on its inner periphery. This is preferably a UV-opaque protective jacket which protects all those sites which are not to be illuminated and is interrupted only on those regions through which the UV light is intended to pass in order to cure the embossing layer which can be cured by UV.

Advantageously a radian measure of the die surface of the nanostructure die according to the present invention in one unwinding direction on the embossing roll with reference to a corresponding circular periphery of the embossing layer to be embossed is an integral part so that in complete embossing of the circular periphery of the embossing layer in the unwinding direction of the embossing roll seamless embossing takes place. To the extent there is an overlapping section in the individual embossing steps, the radian measure can be expanded by the overlapping section.

In addition it is provided that the die can be dynamically deformed by deformation means, especially by external influence, in the micrometer and/or nanometer ranges, especially can be stretched and/or compressed.

In one embodiment of the deformation means this is achieved by the thermal expansion of the die by heating and/or cooling. In another embodiment, piezomaterials are used. For one skilled in the art in the field it is clear that the stretching of the die can be achieved in any manner, as long as it is ensured that the embossing structures pass seamlessly into one another when the surface is closed. To do this, there can be measurement means for measuring the ratios of the die surface relative to the circular periphery of the embossing roll, especially for detection during the working (embossing). Alternatively, the degree of deformation can be fixed by calibration, especially by an embossing of the periphery. It is also conceivable according to the present invention to measure the periphery of the embossing roll with and/or without the embossing layer on the one hand and the dimension of the die surface on the other and then to determine the deformation, especially by computation. Scanning force microscopes and/or optical microscopes and/or scanning electron microscopes are suitable as measurement methods.

An independent invention is also the embossing roll which has been produced with the nanostructure die for continuous embossing of nanostructures with an embossing layer which has been applied to a body of revolution with a jacket surface with at least one peripheral ring which has been embossed in the step-and-repeat process and formed seamlessly in the peripheral direction. Periodically repeating structures can be applied to a workpiece with the embossing roll.

The embossing roll can be advantageously produced by the jacket surface being embossed by the nanostructure die.

It is especially advantageous if the body of revolution is made as a cylinder, especially a circular cylinder. Thus the embossing roll can be advantageously used both in the production of the embossing roll and also in the functional use of the embossing roll in the continuous embossing of nanostructures (imprints).

An independent invention is moreover a device for producing an embossing roll for continuous embossing of nanostructures. It has an embossing roll receiver for accommodation and controllable rotation of a body of revolution of the embossing roll around an embossing roll axis in a working space. The control takes place especially via a central control device. Furthermore the device according to the present invention has a die receiver for accommodation and controllable movement of a nanostructure die relative to one jacket surface of the embossing roll. The control likewise takes place by the central control device, by controlling the embossing roll receiver and the die receiver at least one peripheral ring being producible which has been embossed in the step-and-repeat process and which is made seamless at least in the peripheral direction of the jacket surface. In one advantageous embodiment of the device, the working space is formed by a vacuum chamber and can be exposed to a vacuum so that during the production of the embossing roll an atmosphere which is suitable for production can be established.

According to another embodiment of the invention it is advantageously provided that there are means for applying an embossing layer which forms the jacket surface to a body of revolution of the embossing roll. This embodiment provides for further integration.

In another advantageous embodiment of the invention, it is provided that the device has curing means for curing of the embossed peripheral ring especially in sections, preferably with sections which correspond especially to a die surface of the nanostructure die and which correspond to the step-and-repeat process.

Furthermore an independent invention relates to a method for producing a nanostructure die for producing an embossing roll for continuous embossing of nanostructures with the following steps, especially the following sequence:

fixing of a curved or curvable die negative of the nanostructure die on a peripheral section of one jacket surface of a body of revolution, application of a moldable die form material to the curved die negative, molding of the die form material on a die carrier for forming a concavely curved nanostructured die surface, curing of the die form material.

According to one advantageous embodiment of the invention it is provided that the peripheral section extends over less than half, especially less than ⅓, preferably less than ¼ of the periphery of the jacket surface. The embossing force is applied more uniformly by these measures.

To the extent the body of revolution is a body of revolution of the embossing roll, the curvature of the die surface corresponds exactly to the shape of the embossing roll during embossing, especially when the thickness of the die negative corresponds roughly to the thickness of the embossing layer on the embossing roll.

According to another independent aspect of this invention, it relates to a method for producing an embossing roll for continuous embossing of nanostructures with the following steps, especially the following sequence:

receiving a body of revolution with an embossing layer which has a jacket surface onto an embossing roll receiver which is located in a working space, embossing of a peripheral ring which is made seamless in the peripheral direction of the jacket surface by means of a nanostructure die held on a die receiver in the step-and-repeat process.

The arrangement of the peripheral ring agrees exactly with the axis of rotation of the body of revolution of the embossing roll by embossing being done by rotation of the body of revolution in several especially sequentially running stamping steps.

According to another advantageous embodiment of this invention it is provided that the stamping steps are carried out for alignment partially overlapping on the structure which has been embossed beforehand. In this way an alignment of the nanostructure die on previously embossed and cured structures is conceivable so that high precision alignment takes place using the structures which have been embossed by the different stamping steps.

Because there are several stamping steps parallel to the axis of rotation in each rotation position the embossing roll is embossed to completion after a single complete rotation around the axis of rotation (therefore roughly 360 degrees, optionally with slight overlapping).

Features disclosed for the hardware should also be considered as disclosed as method features and vice versa.

Other advantages, features and details of the invention are illustrated by the following description of preferred exemplary embodiments and using the drawings; the drawings are schematic.

BRIEF DESCRIPTION OF THE DRAWINGS

FIGS. 2a to 2f show one embodiment of a method according to the present invention for producing a nanostructure die for producing an embossing roll for continuous embossing of nanostructures, FIGS. 3a to 3g show one embodiment of a method according to the present invention for producing an embossing roll for continuous embossing of nanostructures, FIG. 4a shows a plan view of a partially embossed embossing roll after a first step-and-repeat process sequence and FIG. 4b shows a plan view of an embossing roll with partially embossed structures after a second execution of the step-and-repeat process, FIG. 5 shows a sequence of the method of continuous embossing by means of the embossing roll according to the present invention for producing an "endlessly" or continuously embossed embossing substrate.

In the figures advantages and features of the invention are labeled with the reference numbers which identify them according to the embodiments of the invention, components or features with the same or equivalent function being labeled with the same reference numbers.

Figure 1A:
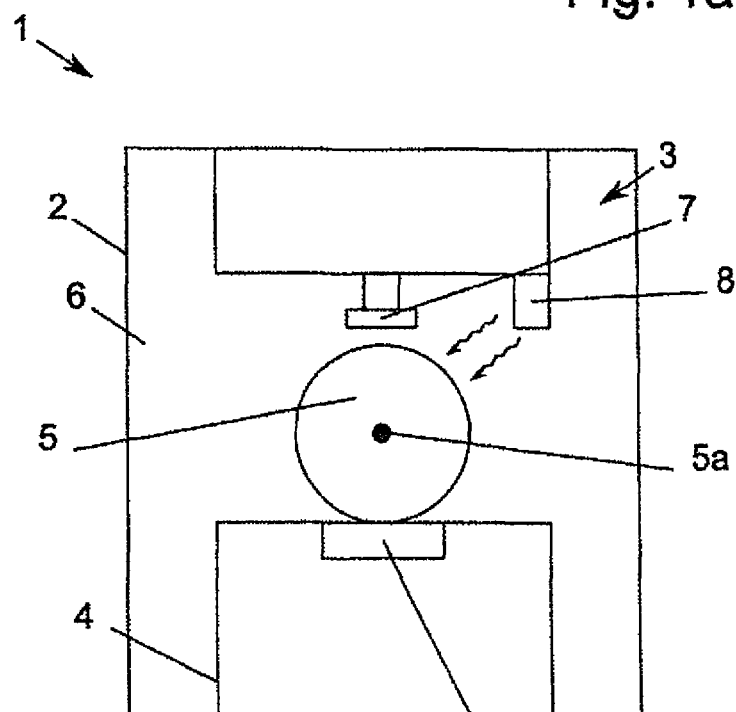
FIG. 1a shows a first embodiment of the device according to the present invention for producing an embossing roll for continuous embossing of nanostructures.

The figures do not show the features of the present invention to scale, in order to be able to represent the function of the individual features. The relationships of the individual components are in part not proportional; this can be attributed especially to the nanostructures 14 which are shown highly enlarged. The nanostructures 14 which are embossed with this invention or which are used for embossing of corresponding nanostructures onto workpieces are in the nanometer and/or micrometer range, while the order of magnitude of the machine components is in the centimeter range.

DETAILED DESCRIPTION OF THE INVENTION

FIG. 1 schematically shows a vacuum chamber 2 which encompasses a working space 6 which can be exposed to a vacuum. The vacuum chamber 2 can be loaded via a sealed door or lock which is not shown.

In the working space 6 on one bottom of the vacuum chamber 2 there is an embossing roll receiver 4 for accommodation and controllable rotation of a body of revolution 5. The body of revolution 5 is a component of an embossing roll 16 for continuous embossing of the nanostructures 14, the embossing roll 16 being produced with the device shown in FIG. 1. The rotation of the body of revolution 5 takes place around one embossing roll axis 5a which runs concentrically to the body of revolution 5 in the form of a circular cylinder. Corresponding driving means for exactly controllable driving of the body of revolution 5 at least in one direction of rotation is assumed to be known.

Above the body of revolution 5, by means of a die receiver 3 a nanostructure die 1 can be positioned, the die receiver 3 for accommodation and controllable movement of the nanostructure die 1 being movable relative to one jacket surface 5o of the body of revolution 5 or of the embossing roll 16 at least in one X, Y and one Z direction. The relative movement in the X and/or Y and/or Z direction can take place by moving the nanostructure die 1 by means of the die receiver 3 and/or by moving the body of revolution 5 by the embossing roll receiver 4. Thus the illustrated device is suitable for carrying out the step-and-repeat process.

In other words: The nanostructure die 1 has at least three degrees of translational freedom (X, Y and Z direction), especially in addition one degree of rotational freedom relative to the body of revolution 5. The body of revolution 5 has one degree of freedom in the rotation direction around the embossing roll axis 5a, especially in addition two degrees of translational freedom (in the X and Y direction). The degree of rotational freedom of the body of revolution 5 is provided in order for the body of revolution 5 to continue to turn around the embossing roll axis 5a after one embossing step or the embossing of several embossing steps.

Figure 1B:
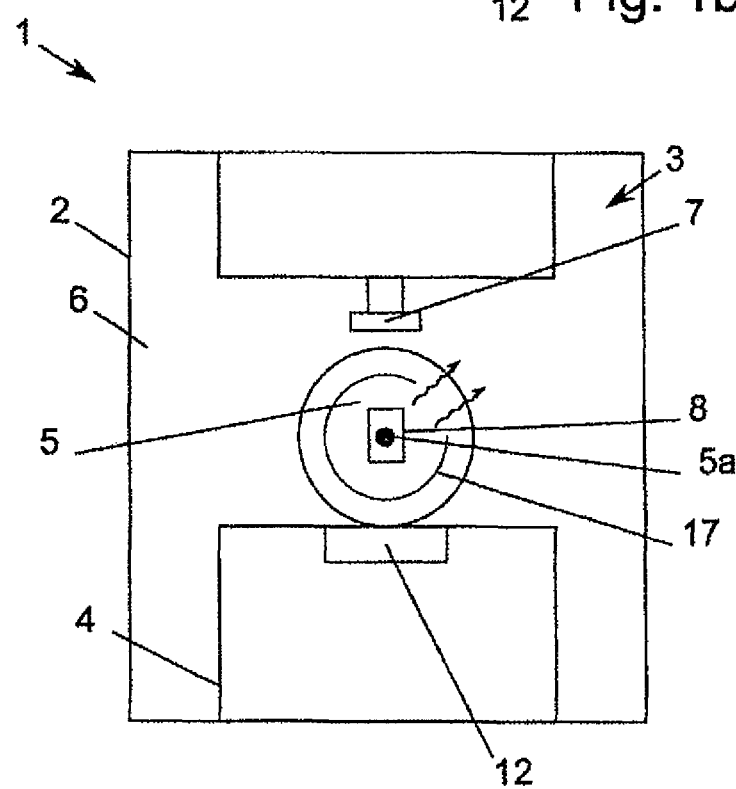
FIG. 1b shows a second embodiment of the device according to the present invention for producing an embossing roll for continuous embossing of nanostructures.

According to FIG. 1, there are moreover curing means in the form of a UV source 8 and/or a heating system 12 for curing of nanostructures 14 which have been embossed with the nanostructure die 1 on the jacket surface 5o (see below on FIGS. 3a to 3g for more detailed description). The UV source 8 and/or the heating system 12 have to be positioned relative to the nanostructure die 1 such that the curing of the just newly produced nanostructures 14 takes place after a certain time interval, preferably as quickly as possible, most preferably immediately. The positioning of the heating system 12 according to FIG. 1a relative to the nanostructure die 1 is therefore not the optimum, but the most obvious embodiment. In one special embodiment the UV source can also be located within a (hollow) cylinder (body of revolution 5) according to FIG. 1b. The UV source 8 can be surrounded by a protective jacket 17 (shielding means) which can be rotated especially opposite or relative to the body of revolution in order to ensure that the UV light strikes the embossing layer 13 only in a region which is to be cured.

First of all, the production of the nanostructure die 1 according to FIGS. 2a to 2f is explained; this need be done only once especially for the production of several embossing rolls 16 since advantageously several embossing rolls 16 can be produced with one nanostructure die 1.

First of all, a die negative 9 (negative of the nanostructure die 1) is formed on a flat, planar substrate (see FIG. 2a). The planar substrate consists preferably of a polymer or a thin structured metal foil or a material which can be flexibly adapted to a curved surface (here the jacket surface 5o of the body of revolution 5 which is used for producing the embossing roll 16). Thus the shape of the die negative 9 after application to the jacket surface 5o according to FIG. 2b corresponds exactly to the shape of the nanostructures 14 which are to be embossed, especially when the thickness of the die negative 9 corresponds to the thickness of a embossing layer 13 which is to be applied to the jacket surface 5o (see FIG. 3a). The embossing layer 13 is thinner than 1 mm, preferably thinner than 0.1 mm, more preferably thinner than 1 µm, still more preferably thin than 0.1 µm, most preferably thinner than 100 nm, most preferably of all thinner than 10 nm.

Subsequently the die form material 10 is applied to the die negative 9 by a means for applying the die form material 10, which means is not shown (see FIG. 2c). The application can take place semiautomatically or fully automatically, but manual application is also conceivable.

Then the die carrier 11 is positioned relative to the die negative 9 so that the die form material 10 is located between the die negative 9 and the die carrier 11 (see FIG. 2d). There are corresponding means, especially a robot arm, for positioning/alignment/holding of the die carrier 11.

In the method step which is shown in FIG. 2; the die carrier 11 is moved in the direction of the body of revolution 5 or of the embossing roll axis 5a or the die negative 9 so that the die form material 10 is distributed between the die negative 9 and the die carrier 11. In this way the structures (depressions and elevations) of the die negative 9 are filled with the die form material 10 up to or beyond one edge 9*r* of the die negative 9.

The die form material 10 is cured by curing means which are not shown (analogously to FIG. 1) and a die positive is formed on one die surface 7*f* of a die form 7 which has been formed by it. At the same time the die form 7 is connected especially permanently to the die carrier 11. The curing means can be especially UV radiators, infrared radiators or heaters. It is moreover conceivable to heat the body of revolution 5 itself, especially by arrangement of an electromagnetic radiation within the body of revolution 5.

After curing, the finished nanostructure die 1 is raised off the body of revolution 5 or the die negative 9.

Alternatively to the above described nanostructure die, the production of a hard die is also conceivable which is produced with considerable additional cost in the known manner, but in the other aspects can be used in the production of the roll. These hard dies are in any case complex and expensive to produce, especially with lithography methods and/or electron beam methods and/or milling methods; this can be done with extreme difficulty in curved die topography and for the very small structures compared to the approach of the present invention.

In FIG. 3 the nanostructure die 1 is used in the device which is shown in FIG. 1. First of all, the body of revolution 5 is coated on its especially entire jacket surface 5*o* with the embossing layer 13 so that it forms a (new) jacket surface 13*o*. The coating of the embossing layer 13 takes place preferably by rotation of the body of revolution 5 in an immersion bath which accommodates only one peripheral section of the body of revolution or by spray methods, droplet dispersion, PVD methods or CVD methods. Alternatively the immersion of the entire body of revolution 5 into an immersion bath is conceivable. The coating material for the embossing layer 13 is preferably a liquid polymer. After exposing the jacket surface 5*o* to the material of the embossing layer 13, the embossing layer 13 is produced in the desired thickness, especially thinner than 1 mm, preferably thinner than 0.1 mm, more preferably thinner than 1 µm, still more preferably thinner than 0.1 µm, most preferably thinner than 100 nm, most preferably of all thinner than 10 nm.

The embossing structures themselves have an average lateral resolution of less than 1 mm, preferably less than 0.1 mm, more preferably less than 1 µm, still more preferably less than 0.1 µm, most preferably less than 100 nm, most preferably of all less than 10 nm.

The diameter of the embossing roll (16) can be chosen at will. For example, but not exclusively it is larger than 1 mm, preferably larger than 1 cm, more preferably larger than 10 cm, most preferably larger than 1 m, most preferably of all larger than 10 m. Initial prototypes of the embodiment of the present invention are implemented with diameters of the embossing roll (16) between 10 cm and 50 cm. The larger the diameter of the embossing roll (16), the gentler the separation of the microstructures and/or nanostructures (14) from the nanostructures (19).

Then the roll carrier 5 with the embossing layer 13 applied and cured (as shown in FIG. 3*a* and FIG. 1) is positioned and aligned, not only in the Y direction and the rotational position or angular position of the nanostructure die relative to the body of revolution 5, but also in the X direction along the jacket surface 13*o* parallel to the embossing roll axis 5*a* (see in this respect especially FIGS. 4*a* and 4*b*). Moreover it is essential to align the nanostructure die 1 exactly in the rotational position.

After alignment the nanostructure die 1 is moved in the Z direction (therefore toward the embossing roll axis 5*a*) until a first embossing section 14.1 (FIG. 4*a*) or 14.3 (FIG. 4*b*) of the nanostructures 14 is embossed from the die positive of the die surface 7*f*. At least predominantly, preferably completely adjacent structure sections 14.*n* are embossed in sequence since in this way an alignment to structures which have been embossed beforehand, especially an overlapping structure 14*e* (overlapping section) on the edge of a structure section 14.[*n*−1] which has been embossed beforehand is possible. In sequential embossing there are the alternatives shown in FIG. 4*a* and FIG. 4*b*.

In the embodiment shown in FIG. 4*a*, first of all as the first stamping step, a nanostructure section 14.1 which corresponds to the die surface 7*f* is embossed and then a second structure section 14.2 in one stamping step is embossed by rotation of the body of revolution 5.

In the embodiment which is shown in FIG. 4*b*, after embossing of a first nanostructure section 14.3 a row of several structure sections 14.3, 14.4, 14.5, 14.6 and 14.7 which runs parallel to the embossing roll axis 5*a* is embossed in sequence, during which no rotation of the body of revolution 5 takes place. Thus during the five embossing steps shown here only the nanostructure die 1 need be moved in the X direction and aligned especially on a structure of the nanostructure section 14.[*n*−1] which had been embossed just previously. After embossing of the nanostructure sections 14.3 to 14.7 the body of revolution 5 rotates so that the next row can be embossed and so forth.

Each embossing step consists of the steps which are shown in FIGS. 3*c* to 3*e*, specifically raising of the nanostructure die 1 (FIG. 3*c*), rotation of the body of revolution 5 and/or movement of the nanostructure die 1 in the X direction (see FIG. 3*d*) and embossing of the structure section 14.*n*, especially by overlapping of at least one overlapping structure 14*e* which is provided on the edge of the previous nanostructure section (FIG. 3*e*).

The described processes are repeated until the entire jacket surface 13*o* of the embossing layer 13 is provided with nanostructures 14 (see FIG. 3*g*).

In the embodiment which is shown in FIG. 4*a* first a peripheral ring 15 which corresponds to the width of the die surface 7*f* in the X direction is embossed, while in the embodiment shown in FIG. 4*b* a peripheral ring 15' which extends essentially over the entire width of the jacket surface 5*o* is embossed.

In the embodiment according to FIG. 4*a*, to cover the entire jacket surface 5*o* accordingly several peripheral rings 15 which are arranged next to one another must be embossed so that the body of revolution 5 must be repeatedly turned completely around its own axis. In the embodiment shown in FIG. 4*b* only a single revolution by roughly 360 degrees (somewhat more for overlapping) is necessary. It is however important that in overlapping the already embossed structures are not destroyed by the overlapping part of the die, but it engages the already existing structures without destroying them.

In any case, after each stamping step a raising of the nanostructure die 1 is necessary. Furthermore, it is preferred that the embossed nanostructure section 14.*n* be cured before or after raising, therefore before or after each stamping step. Multiple curing is also conceivable, after each individual embossing step of the nanostructure die 1 "precuring" being conceivable. It is also conceivable to carry out the deposition of the die material (embossing layer 13) only between the nanostructure die 1 and the body of revolution 5, to carry out the die (embossing) and curing process, to continue to turn the body of revolution 5 and only afterwards to coat the next part of the jacket surface 5o. This prevents material which may have been applied to the lower and side surface of the jacket surface 5o from being deformed by gravity and the thickness of the embossing layer 13 from becoming nonuniform.

Otherwise it is critical to the invention that the viscosity of the embossing layer 13 after applying the embossing layer 13 be small enough for embossing, but large enough not to run.

It is preferred if when the peripheral ring 15 is closed, therefore during embossing of the nanostructure section 14.n which is the last for each peripheral ring 15, a seamless nanostructure section 14.n be embossed which agrees especially at a distance with the remaining nanostructure sections 14.n.

Since with the method of the present invention a nanostructure die 1 can be easily produced, a perfect transition can be achieved by producing an exactly matched nanostructure die 1.

In order to adapt the nanostructure die 1 to the specific body of revolution 5, sample embossing according to a single peripheral ring 15 according to FIG. 4a is conceivable. To the extent the embossing takes place perfectly, the nanostructure die 1 can be used for producing several embossing rolls 16. Otherwise the difference from the (correct) distance can be determined and an altered die negative 9 can be computed therefrom for producing a new nanostructure die 1.

FIG. 5 shows the continuous embossing of an embossing substrate 18 which is provided more or less continuously with nanostructures 19 by means of the embossing roll 5, which in contrast to the prior art leads to uniform and seamless nanostructures 19 on the embossing substrate 18 which has been produced in this way.

REFERENCE NUMBER LIST 1 nanostructure die
2 vacuum chamber
2b bottom
3 die receiver
4 embossing roll receiver
5 body of revolution
5o jacket surface
5a embossing roll axis
6 working space
7 die form
7f die surface
8 radiator
9 die negative
9r edge
10 die form material
11 die carrier
12 heating means
13 embossing layer
13o jacket surface
14 nanostructures
14.1 to 14.n nanostructure section
14e overlapping structure
15 peripheral ring
16 embossing roll
17 protective jacket
18 embossing substrate
19 nanostructures Having described the invention, the following is claimed:

1. A method of manufacturing a nanostructure die for production of an embossing roll, said method comprising:
fixing a curved or curvable die negative of the nanostructure die to a peripheral section of a curved jacket surface of a body of revolution;
applying a moldable die form material to the curved die negative;
molding the die form material on a die carrier according to a structure of the curved die negative; and
curing the molded die form material to form a concavely curved die positive on the die carrier.

2. The method as claimed in claim 1, wherein the peripheral section of the curved jacket surface is less than half of the curved jacket surface.

3. The method as claimed in claim 1, wherein the peripheral section of the curved jacket surface is less than a third of the curved jacket surface.

4. The method as claimed in claim 1, wherein the peripheral section of the curved jacket surface is less than a fourth of the curved jacket surface.

5. A method of manufacturing an embossing roll from a nanostructure die, the method comprising:
applying a moldable die form material to a curved die negative;
molding the die form material on a die carrier according to a structure of the curved die negative;
curing the molded die form material to form a concavely curved nanostructure die positive on the die carrier;
coating each peripheral section of a curved jacket surface of a body of revolution with an embossing layer; and
molding the embossing layer with the die positive at each peripheral section of the curved jacket surface to form the embossing roll.

6. The method as claimed in claim 5, further comprising:
fixing the curved die negative to a correspondingly curved surface prior to applying the moldable die form material to the curved die negative.

7. The method as claimed in claim 6, wherein the correspondingly curved surface is the curved jacket surface of the body of revolution.

8. A method of embossing a substrate, comprising:
applying a moldable die form material to a curved die negative;
molding the die form material on a die carrier according to a structure of the curved die negative;
curing the molded die form material to form a concavely curved nanostructure die positive on the die carrier;
coating each peripheral section of a curved jacket surface of a body of revolution with an embossing layer;
molding the embossing layer with the die positive at each peripheral section of the curved jacket surface to form an embossing roll; and
continually embossing the substrate with the embossing roll to create a plurality of nanostructures on the substrate.

9. The method as claimed in claim 8, further comprising:
fixing the curved die negative to a correspondingly curved surface prior to applying the moldable die form material to the curved die negative.

10. The method as claimed in claim 9, wherein the correspondingly curved surface is the curved jacket surface of the body of revolution.

* * * * *